United States Patent
Yao et al.

(10) Patent No.: US 10,403,228 B2
(45) Date of Patent: Sep. 3, 2019

(54) SHIFT REGISTER UNIT, SHIFT REGISTER, DISPLAY PANEL AND DISPLAY DEVICE

(71) Applicant: BOE TECHNOLOGY GROUP CO., LTD., Beijing (CN)

(72) Inventors: Xing Yao, Beijing (CN); Yuanbo Zhang, Beijing (CN); Seungwoo Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 165 days.

(21) Appl. No.: 14/909,661

(22) PCT Filed: Jul. 15, 2015

(86) PCT No.: PCT/CN2015/084079
§ 371 (c)(1),
(2) Date: Feb. 2, 2016

(87) PCT Pub. No.: WO2016/141652
PCT Pub. Date: Sep. 15, 2016

(65) Prior Publication Data
US 2017/0039987 A1   Feb. 9, 2017

(30) Foreign Application Priority Data

Mar. 9, 2015 (CN) .......................... 2015 1 0102986

(51) Int. Cl.
*G11C 19/00* (2006.01)
*G09G 5/00* (2006.01)
(Continued)

(52) U.S. Cl.
CPC .............. *G09G 5/003* (2013.01); *G09G 3/20* (2013.01); *G09G 3/30* (2013.01); *G11C 19/28* (2013.01);
(Continued)

(58) Field of Classification Search
None
See application file for complete search history.

(56) References Cited

U.S. PATENT DOCUMENTS 7,400,698 B2 * 7/2008 Chang .................... G11C 19/28
377/64
7,436,923 B2 * 10/2008 Tobita .................. G09G 3/3677
377/64

(Continued)

FOREIGN PATENT DOCUMENTS

CN 102629444 A 8/2012
CN 102779478 A 11/2012
(Continued)

OTHER PUBLICATIONS

Written Opinion of the International Searching Authority for international application No. PCT/CN2015/084079.

*Primary Examiner* — Tuan T Lam
(74) *Attorney, Agent, or Firm* — Harness, Dickey & Pierce, P.L.C.

(57) ABSTRACT

A shift register unit includes: a discharging TFT, a source electrode and a drain electrode of which are connected to a first low level signal input end and a pull-up node respectively; and a first discharging control unit connected to a gate electrode of the discharging TFT and configured to output a first control signal to the gate electrode of the discharging TFT between a first and a second time points, so as to enable the discharging TFT to be in an on state and output a first low level signal to the pull-up node, thereby to discharge the pull-up node. The first time point is a time point when the processing of a first frame by the shift register is ended, and the second time point is a time point when the processing of a second frame adjacent to the first frame by the shift register is started.

10 Claims, 11 Drawing Sheets

(51) Int. Cl.
  *G09G 3/30* (2006.01)
  *G11C 19/28* (2006.01)
  *G09G 3/20* (2006.01)
  *G09G 3/36* (2006.01)
(52) U.S. Cl.
  CPC ... *G09G 3/3677* (2013.01); *G09G 2300/0426* (2013.01); *G09G 2310/0251* (2013.01); *G09G 2310/0267* (2013.01); *G09G 2310/0286* (2013.01); *G09G 2310/0291* (2013.01)

(56) References Cited

U.S. PATENT DOCUMENTS

| | | | | |
|---|---|---|---|---|
| 7,688,934 B2* | 3/2010 | Tsai | | G11C 19/28 377/64 |
| 7,978,809 B2* | 7/2011 | Lai | | G11C 19/28 377/64 |
| 8,175,215 B2* | 5/2012 | Liu | | G11C 19/28 377/64 |
| 8,411,017 B2* | 4/2013 | Hsu | | G11C 19/28 345/100 |
| 8,571,169 B2* | 10/2013 | Tobita | | G09G 3/3677 377/64 |
| 8,860,648 B2* | 10/2014 | Lee | | G11C 19/28 345/100 |
| 8,942,339 B2* | 1/2015 | Jang | | G11C 19/28 377/64 |
| 2002/0149318 A1* | 10/2002 | Jeon | | G09G 3/3648 315/169.1 |
| 2003/0227433 A1* | 12/2003 | Moon | | G09G 3/3677 345/100 |
| 2006/0227094 A1* | 10/2006 | Park | | G09G 3/3677 345/100 |
| 2007/0086558 A1* | 4/2007 | Wei | | G11C 19/28 377/64 |
| 2007/0297559 A1* | 12/2007 | Cho | | G09G 3/3677 377/64 |
| 2011/0044423 A1* | 2/2011 | Lin | | G09G 3/32 377/64 |
| 2011/0058640 A1* | 3/2011 | Shang | | G11C 19/184 377/64 |
| 2011/0150169 A1 | 6/2011 | Lin et al. | | |
| 2012/0188211 A1* | 7/2012 | Tsai | | G09G 3/20 345/205 |
| 2014/0091997 A1* | 4/2014 | Han | | G09G 3/3677 345/92 |
| 2014/0098013 A1* | 4/2014 | Chen | | G09G 3/3677 345/92 |
| 2014/0098015 A1* | 4/2014 | Wang | | G09G 3/3677 345/100 |
| 2014/0133621 A1* | 5/2014 | Shang | | G11C 19/184 377/67 |
| 2014/0192039 A1* | 7/2014 | Wang | | G11C 19/28 345/213 |
| 2015/0325181 A1* | 11/2015 | Wang | | G09G 3/3677 377/64 |
| 2015/0356934 A1* | 12/2015 | Yamashita | | G09G 3/3611 345/205 |
| 2016/0012911 A1* | 1/2016 | Han | | G09G 3/20 377/64 |
| 2016/0111065 A1* | 4/2016 | Wang | | G11C 19/28 345/213 |
| 2016/0275902 A1* | 9/2016 | Xue | | G09G 5/003 |
| 2016/0307641 A1* | 10/2016 | Zheng | | G09G 3/3677 |
| 2016/0372031 A1* | 12/2016 | Li | | G09G 3/3225 |
| 2017/0278473 A1* | 9/2017 | Shang | | G09G 3/36 |
| 2017/0316751 A1* | 11/2017 | Wang | | G09G 3/3685 |

FOREIGN PATENT DOCUMENTS

| | | |
|---|---|---|
| CN | 102819998 A | 12/2012 |
| CN | 103440839 A | 12/2013 |
| CN | 203422915 U | 2/2014 |
| CN | 104134416 A | 11/2014 |
| CN | 104616618 A | 5/2015 |
| CN | 204423875 U | 6/2015 |
| JP | H10-97229 A | 4/1998 |
| KR | 20040061958 A | 7/2004 |
| TW | 571513 B | 1/2004 |
| TW | 201209490 A | 3/2012 |

* cited by examiner

SHIFT REGISTER UNIT, SHIFT REGISTER, DISPLAY PANEL AND DISPLAY DEVICE

CROSS-REFERENCE TO RELATED APPLICATION APPLICATIONS

The present application is the U.S. national phase of PCT Application No. PCT/CN2015/084079 filed on Jul. 15, 2015, which claims a priority of the Chinese patent application No. 201510102986.8 filed on Mar. 9, 2015, the entire disclosures of both of which are incorporated herein by reference in theft entirety.

TECHNICAL FIELD

The present disclosure relates to the field of display technology, in particular to a shift register unit, a shifter register, a display panel and a display device.

BACKGROUND

In the related art, when processing each frame, a potential at a pull-up node is pulled down to discharge after a gate driving signal is outputted from a current-level driving output node, so as to prevent a gate driving signal output control transistor from being turned on falsely during the processing of the current frame, thereby to prevent the occurrence of false output of the gate driving signal.

However, in the related art, generally the potential at the pull-up node is pulled down to discharge by using an output signal from a next-level shift register unit as a resetting signal. This output signal is a pulse signal with a very short duration, and limited electric quantity is released, so the pull-up node will be discharged incompletely.

Such an incomplete discharging for the intraframe processing might not be a big deal within a short period of time, but after the shift register unit operates for a long period of time, more electric quantity may be accumulated, resulting in that the pull-up node is at an inaccurate level. Furthermore, when the pull-up node is still maintained at a high level after the gate driving signal is outputted from the current-level driving output node, the gate driving signal output control transistor will be still in an on state, resulting in the false output of the gate driving signal.

SUMMARY

Technical Problem to be Solved

An object of the present disclosure is to provide a shift register unit, a shift register, a display panel and a display device, so as to ensure normal operation of the shift register unit as possible.

Technical Solution

In one aspect, the present disclosure provides in some embodiments a shift register unit, and a plurality of the shift register units is cascaded to form a shift register. The shift register unit includes a bootstrapping capacitor connected between a current-level driving output node and a pull-up node. The shift register unit further includes: a first low level signal input end configured to receive a first low level signal; a discharging thin film transistor (TFT), a source electrode and a drain electrode of which are connected to the first low level signal input end and the pull-up node respectively; and a first discharging control unit connected to a gate electrode of the discharging TFT and configured to output a first control signal to the gate electrode of the discharging TFT between a first time point and a second time point, so as to enable the discharging TFT to be in an on state, thereby to output the first low level signal to the pull-up node and discharge the pull-up node.

The first time point is a time point when processing of a first frame by the shift register is ended, and the second time point is a time point when processing of a second frame adjacent to the first frame by the shift register is started.

Alternatively, the discharging TFT is a first resetting TFT, the gate electrode of which is connected to a resetting signal input end, or a pull-down TFT, the gate electrode of which is connected to a pull-down node.

Alternatively, the first discharging control unit includes a first control signal input end configured to receive the first control signal between the first time point and the second time point, and a controlling TFT, a gate electrode of which is connected to the first control signal input end, and a source electrode and a drain electrode of which are connected to the first control signal input end and the gate electrode of the discharging TFT respectively.

Alternatively, the shift register unit further includes a first pull-down node potential control unit configured to control the pull-down node to be at a low level when the pull-up node is at a high level, and a second pull-down node potential control unit configured to control the pull-down node to be at a high level after the current-level driving output node outputs a high level.

Alternatively, the first pull-down node potential control unit includes: a TFT, a gate electrode of which is connected to the pull-up node, and a source electrode and a drain electrode are connected to the pull-down node and the first low level signal input end respectively; and a TFT, a gate electrode of which is connected to a start signal input end, and a source electrode and a drain electrode of which are connected to the pull-down node and the first low level signal input end.

Alternatively, the second pull-down node potential control unit includes: a pull-down node control signal input end configured to receive a first pull-down node control signal, which is a high level after a high level is outputted from the current-level driving output node; and a TFT, a gate electrode of which is connected to the pull-down node control signal input end, and a source electrode and a drain electrode of which are connected to the pull-down node control signal input end and the pull-down node respectively.

Alternatively, a high level signal and a low level signal are alternately used as the pull-down node control signal.

Alternatively, the shift register unit further includes a driving signal input end configured to receive a gate driving signal, and a TFT, a gate electrode of which is connected to the pull-up node, and a source electrode and a drain electrode of which are connected to the driving signal input end and the current-level driving output node respectively. The first pull-down node potential control unit further includes a TFT, a gate electrode of which is connected to the gate driving signal input end, and a source electrode and a drain electrode of which are connected to the pull-down node and the first low level signal input end respectively. The gate driving signal is of a phase reverse to the pull-down node control signal.

Alternatively, the shift register unit further includes: a driving signal input end configured to receive a gate driving signal; a TFT, a gate electrode of which is connected to the pull-up node, and a source electrode and a drain electrode of which are connected to the driving signal input end and the current-level driving output node; a first resetting TFT, a gate electrode of which is connected to the resetting signal input end, and a source electrode and a drain electrode of which are connected to the first low level signal input end and the pull-up node respectively; and a second resetting TFT, a gate electrode of which is connected to the resetting signal input end, and a source electrode and a drain electrode of which are connected to the current-level driving output node and a second low level signal input end. The first low level signal from the first low level signal input end is at a voltage less than a second low level signal from the second low level signal input end.

Alternatively, the shift register unit further includes: a TFT, a gate electrode of which is connected to the pull-down node, and a source electrode and a drain electrode of which are connected to the current-level driving output node and the second low level signal input end respectively; and/or a TFT, a gate electrode of which is connected to the pull-down node control signal input end, and a source electrode and a drain electrode of which are connected to the current-level driving output node and the second low level signal input end respectively. After the current-level driving output node outputs a high level, a high level is inputted to the pull-down node control signal input end.

Alternatively, the shift register unit further includes: a driving signal input end configured to receive a gate driving signal; a TFT, a gate electrode of which is connected to the pull-up node, and a source electrode and a drain electrode of which are connected to the driving signal input end and the current-level driving output node respectively; a TFT, a gate electrode of which is connected to the pull-up node, and a source electrode and a drain electrode of which are connected to the driving signal input end and a current-level controlling output node respectively; and a TFT, a gate electrode of which is connected to the pull-down node, and a source electrode and a drain electrode of which are connected to the current-level controlling output node and the first low level signal input end respectively. The current-level controlling output node is connected to a start signal input end of a next-level shift register unit and a resetting signal input end of a previous-level shift register unit.

In another aspect, the present disclosure provides in some embodiments a method for driving the above-mentioned shift register unit, including a step of, between a first time point and a second time point, outputting by a first discharging control unit a first control signal to a gate electrode of a discharging TFT, so as to enable the discharging TFT to be in an on state, electrically connect a first low level signal input end and a pull-up node which are connected to a source electrode and a drain electrode of the discharging TFT respectively, and output a first low level signal received by the first low level signal input end to the pull-up node, thereby to discharge the pull-up node.

Alternatively, at a first stage, a first control signal input end receives a low level signal, a start signal input end receives a high level signal, a driving signal input end receives a low level signal, a pull-down node control signal input end receives a high level signal, and a resetting signal input end receives a low level signal. At a second stage, the first control signal input end receives a low level signal, the start signal input end receives a low level signal, the driving signal input end receives a high level signal, the pull-down node control signal input end receives a low level signal, and the resetting signal input end receives a low level signal. At a third stage, the first control signal input end receives a low level signal, the start signal input end receives a low level signal, the driving signal input end receives a low level signal, the pull-down node control signal input end receives a high level signal, and the resetting signal input end receives a high level signal. At a fourth stage, the first control signal input end receives a high level signal, and the start signal input end, the driving signal input end, the pull-down node control signal input end and the resetting signal input end do not receive any signal. The first stage, the second stage and the third stage form a continuous time period within each frame period, and the fourth stage is located between the first time point and the second time point.

In yet another aspect, the present disclosure provides in some embodiments a shift register including a plurality of the above-mentioned shift register units arranged in a cascading manner.

In still yet another aspect, the present disclosure provides in some embodiments a display panel including the above-mentioned shift register.

In still yet another aspect, the present disclosure provides in some embodiments a display device including the above-mentioned display panel.

Beneficial Effect

According to the shift register unit, the shift register, the display panel and the display device in the embodiments of the present disclosure, the shift register unit includes: the first low level signal input end configured to receive the first low level signal; the discharging TFT, the source electrode and the drain electrode of which are connected to the first low level signal input end and the pull-up node respectively; and the first discharging control unit connected to the gate electrode of the discharging TFT and configured to output the first control signal to the gate electrode of the discharging TFT between the first time point and the second time point, so as to enable the discharging TFT to be in the on state and output the first low level signal to the pull-up node, thereby to discharge the pull-up node. The first time point is a time point when the processing of the first frame by the shift register is ended, and the second time point is a time point when the processing of the second frame adjacent to the first frame by the shift register is started. As a result, it is able to pull down a potential at the pull-up node between the processings of two adjacent frames, and release a residual electric signal in the pull-up node after the processing of a previous frame in time, thereby to prevent the residual electric signal from being accumulated as a noise in the processing of a next frame and ensure the normal operation of the shift register unit as possible.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure provides in some embodiments a shift register unit, and a plurality of the shift register units may be cascaded to form a shift register. To be specific, the shift register unit includes a bootstrapping capacitor C connected between a current-level driving output node OUTPUT and a pull-up node PU.

Figure 1:
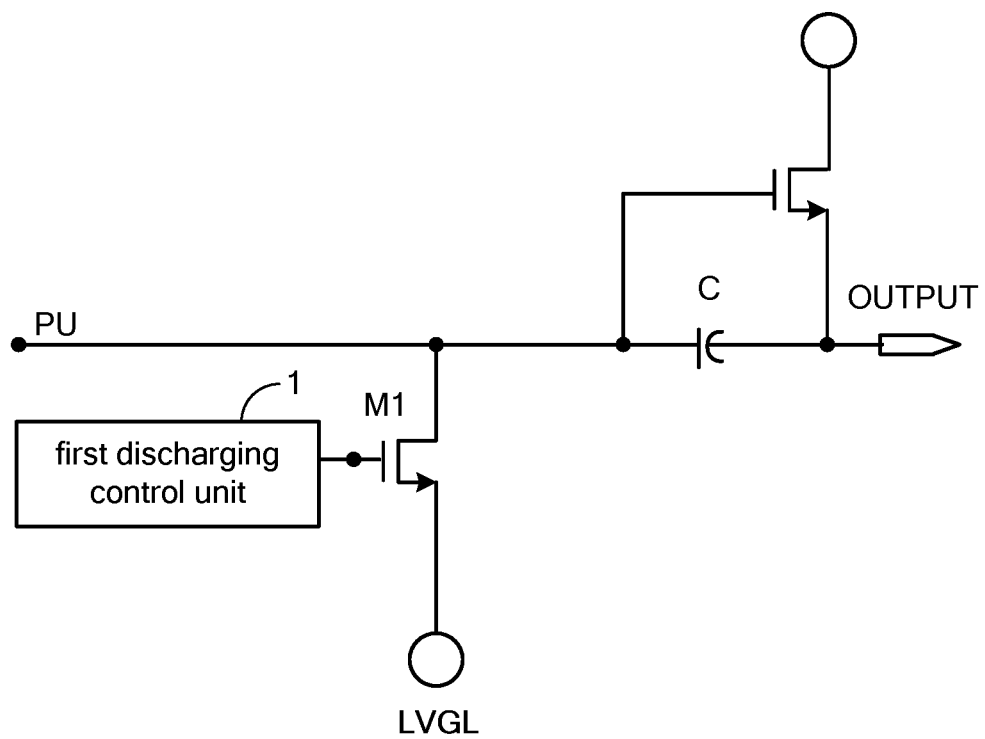
FIG. 1 is a schematic view showing a shift register unit according to one embodiment of the present disclosure.

As shown in FIG. 1, the shift register unit may further include a first low level signal input end LVGL configured to receive a first low level signal; a discharging TFT M1, a source electrode and a drain electrode of which are connected to the first low level signal input end LVGL and the pull-up node PU respectively; and a first discharging control unit 1 connected to a gate electrode of the discharging TFT M1 and configured to output a first control signal to the gate electrode of the discharging TFT M1 between a first time point and a second time point, so as to enable the discharging TFT M1 to be in an on state, thereby to output the first low level signal to the pull-up node PU and discharge the pull-up node PU.

In the embodiments of the present disclosure, the first time point may be an end time point when processing of a first frame by the shift register is ended, and the second time point may be a start time point when processing of a second frame adjacent to the first frame by the shift register is started. Of course, the first time point and the second time point may not be limited thereto.

According to the shift register unit in the embodiments of the present disclosure, through the first pull-down control unit 1, it is able to pull down a potential at the pull-up node PU between the processings of two adjacent frames and release a residual electric signal in the pull-up node after the processing of a previous frame in time, thereby to prevent the residual electric signal from being accumulated as a noise in the processing of a next frame and ensure a normal operation of the shift register unit as possible.

In an alternative embodiment of the present disclosure, the discharging TFT M1 may be arranged separately, so as to achieve a discharging function.

In addition, an operation of the shift register unit may include the following stages. At stage I, the potential at the pull-up node PU is pulled up. At stage II, the potential at the pull-up node PU is pulled up continuously, and the shift register unit outputs a high level. At stage III, i.e., a discharging and resetting stage, the pull-up node PU is discharged to a low level.

It is found that, at stage III, the pull-up node PU needs to be pulled down to a low level and maintained at a low level. At Stage III, there are the following two modes for discharging the pull-up node PU.

Figure 2:
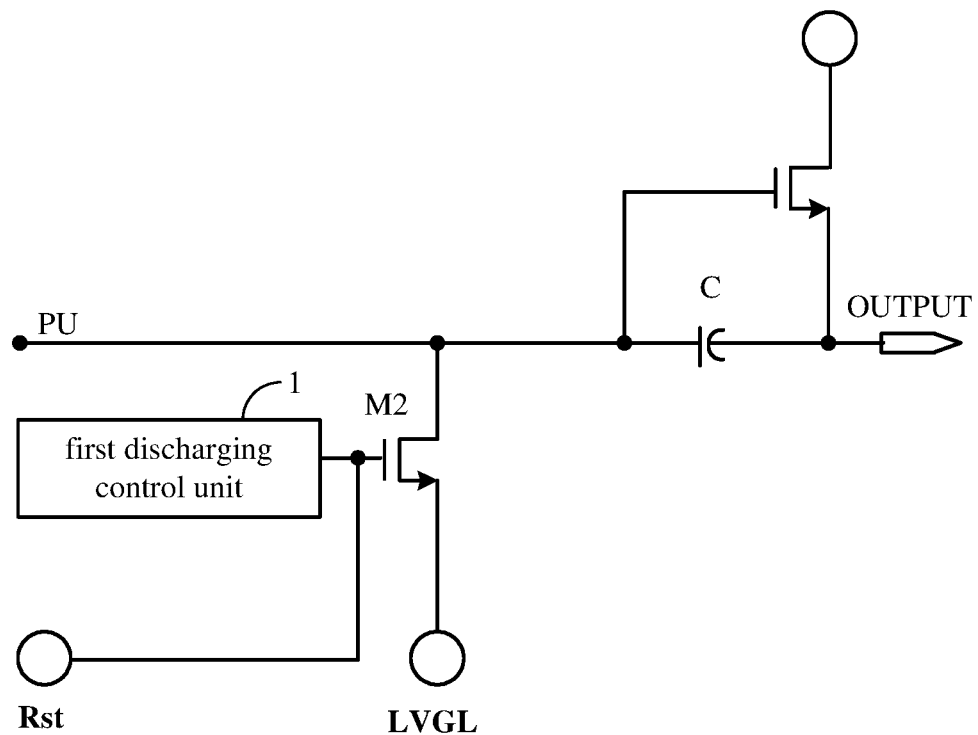
FIG. 2 is another schematic view showing the shift register unit according to one embodiment of the present disclosure.
Figure 3:
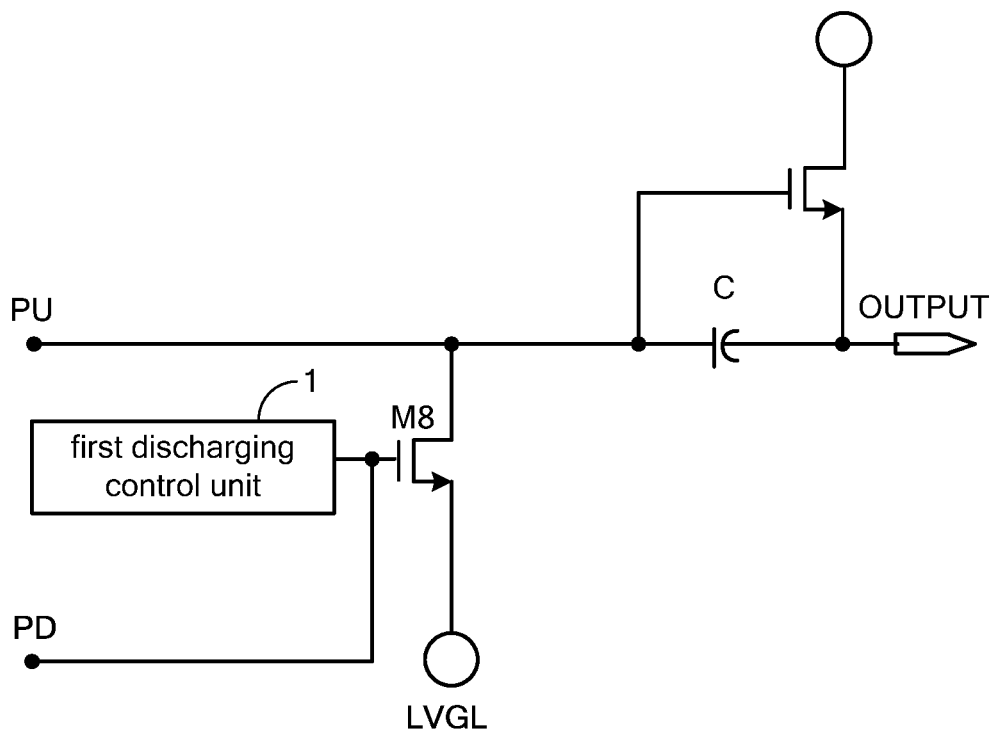
FIG. 3 is yet another schematic view showing the shift register unit according to one embodiment of the present disclosure.

As shown in FIG. 2, when a next-level shift register unit outputs a high level signal, this signal, as a resetting signal for a previous-level shift register unit, is outputted to a gate electrode of a first resetting TFT M2 connecting the pull-up node PU and the low level signal input end. As shown in FIG. 3, a pull-down node PD is at a high level, and a high level signal is outputted to a gate electrode of a pull-down TFT M8 connecting the pull-up node PU and the low level signal input end.

As can be seen from the above, between the two adjacent frames, the first discharging control unit 1 controls the discharging TFT M1 to discharge the pull-up node PU, and during the processing of each frame, it is also required to pull down the potential at the pull-up node PU and discharge the pull-up node PU (e.g., at the discharging and resetting stage). The time points for the two discharging procedures are staggered from each other, i.e., the two discharging procedures will not influence one another. Hence, in the alternative embodiments of the present disclosure, the pull-down TFT M8 or the first resetting TFT M2 may be used as the discharging TFT M1 during the processing of the frames, so as to reduce the number of the TFTs, thereby to simplify the circuit design and reduce the production cost.

Hence, in the alternative embodiments, the discharging TFT M1 may be the first resetting TFT M2 (as shown in FIG. 2), or the pull-down TFT M8 (as shown in FIG. 3).

As shown in FIG. 2, a gate electrode of the first resetting TFT M2 is connected to, apart from the first discharging control unit 1, a resetting signal input end Rst, so that the pull-up node PU is discharged at the discharging and resetting stage as well as within a time period between two consecutive frames by the first resetting TFT M2.

As shown in FIG. 3, a gate electrode of the pull-down TFT M8 is connected to, apart from the first discharging control unit 1, the pull-down node PD, so that the pull-up node PU is discharged at the discharging and resetting stage as well as within the time period between two consecutive frames by the pull-down TFT M8.

Figure 4:
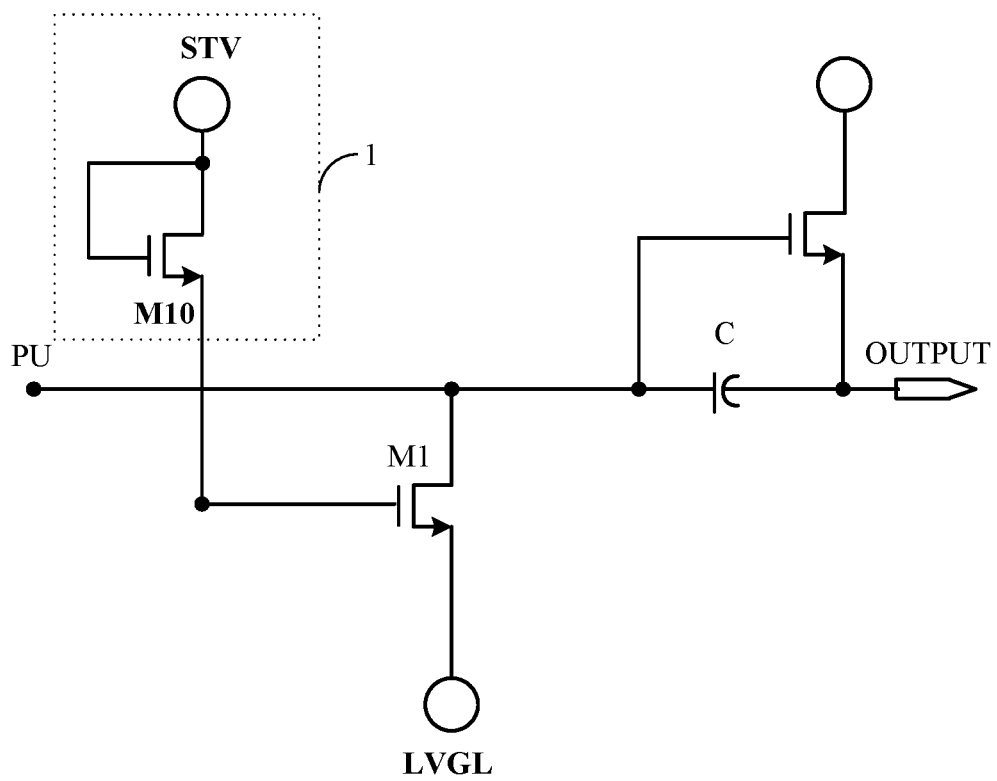
FIG. 4 is still yet another schematic view showing the shift register unit according to one embodiment of the present disclosure.

In an alternative embodiments, as shown in FIG. 4, the first discharging control unit 1 includes a first control signal input end STV configured to receive the first control signal between the first time point and the second time point, and a controlling TFT M10, a gate electrode of which is connected to the first control signal input end STV, and a source electrode and a drain electrode of which are connected to the first control signal input end STV and the gate electrode of the discharging TFT M1 respectively.

In this embodiment as shown in FIG. 4, the discharging TFT may be the discharging TFT M1 arranged separately, the first resetting TFT M2, or the pull-down TFT M8.

Between the first time point and the second time point, the first control signal input end STV receives the first control signal at a certain potential (a high level or a low level), so as to enable the controlling TFT M10 to be in an on state. In this way, the first control signal may be transmitted to the gate electrode of the discharging TFT M1, so as to enable the discharging TFT M1 to be in the on state, thereby to discharge the pull-up node PU between the first time point and the second time point.

In an alternative embodiment of the present disclosure, it is able to ensure pulling down the potential at the pull-down node PD by introducing a voltage control mode for the pull-down node PD, e.g., introducing a start signal at a high level at a pre-charging stage (usually a signal from the previous-level shift register unit). In this way, it is able to prevent the pull-down TFT M8 from being adversely affected by a residual electric signal in the pull-down node PD, thereby to improve the performance of the shift register.

Figure 5:
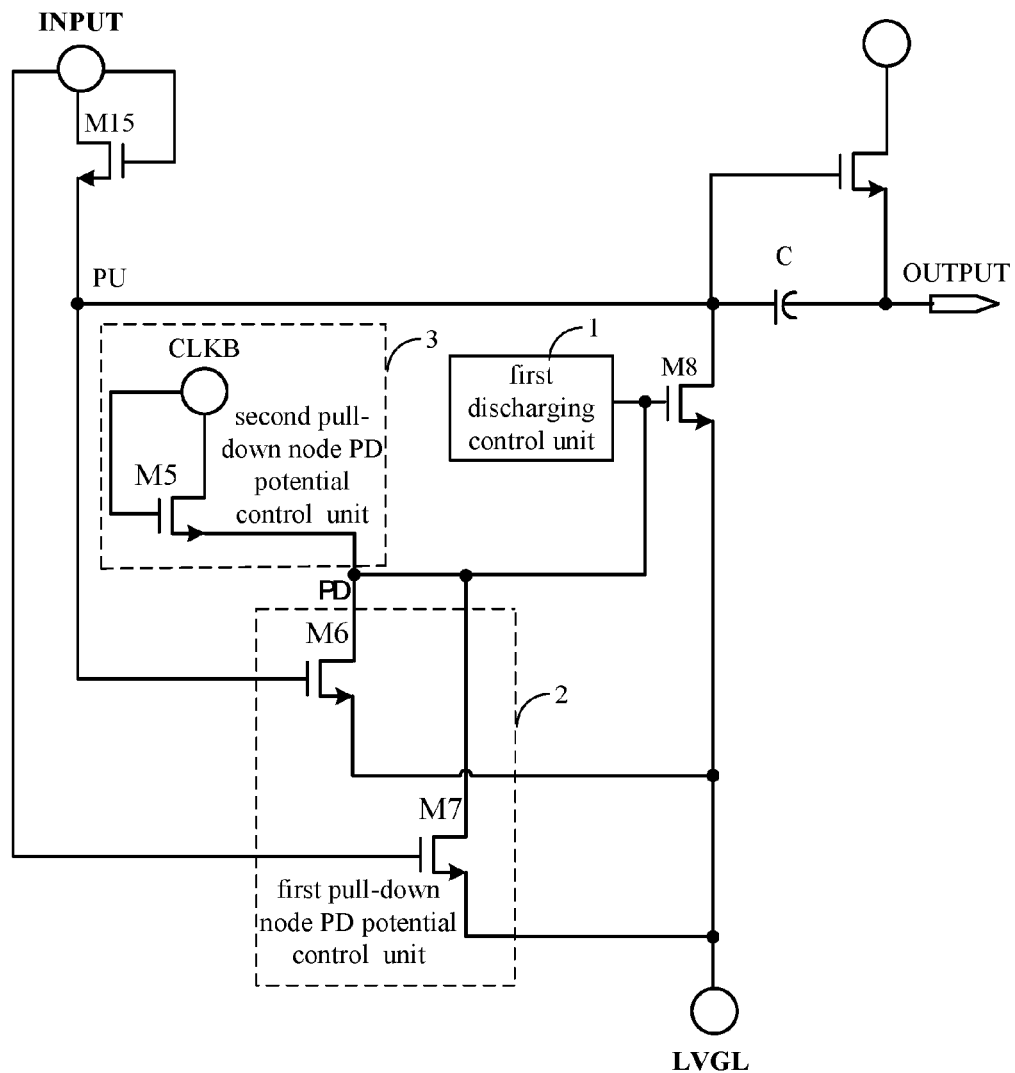
FIG. 5 is still yet another schematic view showing the shift register unit according to one embodiment of the present disclosure.

As shown in FIG. 5, the shift register unit may further include a first pull-down node potential control unit 2 configured to control the pull-down node PD to be at a low level when the pull-up node PU is at a high level, and a second pull-down node potential control unit 3 configured to control the pull-down node PD to be at a high level when the current-level driving output node OUTPUT outputs a high level.

The first pull-down node potential control unit 2 may include: a TFT M6, a gate electrode of which is connected to the pull-up node PU, and a source electrode and a drain electrode are connected to the pull-down node PD and the first low level signal input end LVGL respectively; and a TFT M7, a gate electrode of which is connected to a start signal input end INPUT, and a source electrode and a drain electrode of which are connected to the pull-down node PD and the first low level signal input end LVGL.

In addition, the second pull-down node potential control unit 3 may include: a pull-down node PD control signal input end CLKB configured to receive a first pull-down node PD control signal, which is a high level after a high level is outputted from the current-level driving output node OUTPUT; and a TFT M5, a gate electrode of which is connected to the pull-down node PD control signal input end CLKB, and a source electrode and a drain electrode of which are connected to the pull-down node PD control signal input end CLKB and the pull-down node PD respectively.

In the related art, after the current-level driving output node OUTPUT outputs a high level signal, the pull-down TFT M8 is always in the on state, until the pull-down node PU is at a high level again. Hence, the gate electrode of the pull-down TFT M8 will be at a high voltage for a long period of time, resulting in a short service life thereof. In order to overcome this drawback, in an alternative embodiment of the present disclosure, the pull-down node PD control signal input end CLKB is provided so as to enable the pull-down node PD to be merely at a high level periodically between two pulling-down procedures (i.e., at the discharging and resetting stage). As a result, it is able to remarkably reduce a high-voltage duration of the gate electrode of the pull-down TFT M8 controlled by the pull-down node PD, thereby to increase a service life of the TFT.

In addition, as shown in FIG. 5, the shift register unit may further include a TFT M15, so as to control the start signal input end INPUT.

In the embodiments of the present disclosure, a high level signal and a low level signal may be alternately used as the pull-down node PD control signal.

When the current-level driving output node OUTPUT outputs a high level (i.e., at a charging stage), the pull-down node PD needs to be at a low level, so as to prevent the TFT M3 for control the output of the gate driving signal from being turned off falsely when the pull-down TFT M8 is turned on falsely. In the alternative embodiments of the present disclosure, the TFTs M6 and M7 are provided. However in order to ensure the pull-down node PD to be at an accurate potential, in an alternative embodiment of the present disclosure, a gate driving signal is further introduced so as to control the on state of a newly-added TFT M9, thereby to control the potential at the pull-down node PD and ensure the normal operation of the shift register unit.

Meanwhile, a high level signal and a low level signal are alternately used as the gate driving signal, so as to prevent a gate electrode of the newly-added TFT M9 from being at a high voltage for a long period of time, thereby to increase a service life of the TFT M9.

Figure 6:
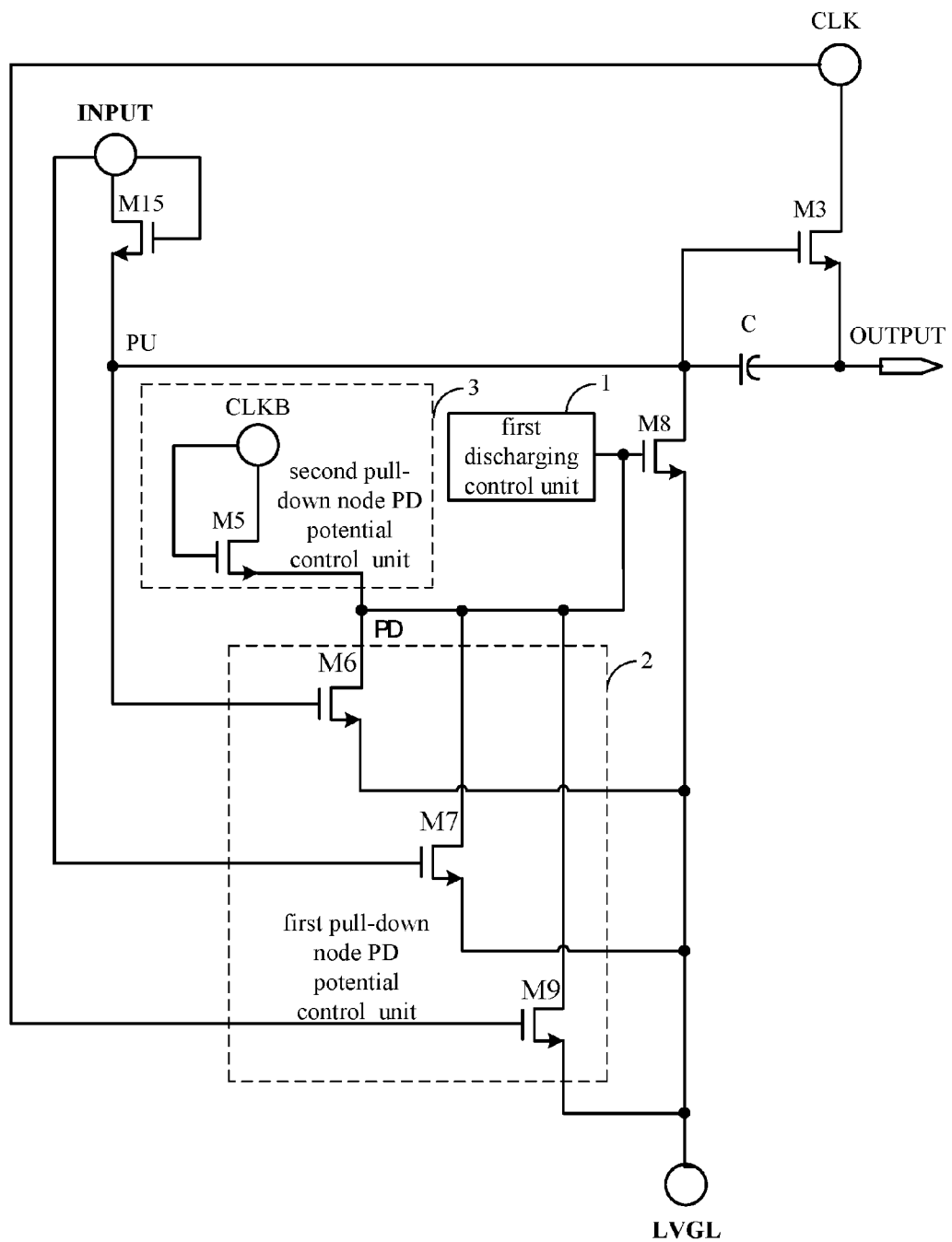
FIG. 6 is still yet another schematic view showing the shift register unit according to one embodiment of the present disclosure.

In an alternative embodiment, as shown in FIG. 6, the shift register unit may further include a driving signal input end CLK configured to receive a gate driving signal, and a TFT M3, a gate electrode of which is connected to the pull-up node PU, and a source electrode and a drain electrode of which are connected to the driving signal input end CLK and the current-level driving output node OUTPUT respectively. The first pull-down node potential control unit 2 may further include a TFT M9, a gate electrode of which is connected to the driving signal input end CLK, and a source electrode and a drain electrode of which are connected to the pull-down node PD and the first low level signal input end LVGL respectively. In the embodiments of the present disclosure, the gate driving signal is of a phase reverse to the pull-down node PD control signal.

For a traditional gate on array (GOA) circuit in the shift register circuit, usually a threshold voltage of the TFT M3 is of a positive value. However, due to such factors as a manufacture process and an operation environment, the threshold voltage of the TFT M3 will be drifted to a negative value. In order to ensure the normal operation of the TFT M3 when its threshold voltage is of a negative value, in an alternative embodiment of the present disclosure, two low level signal input ends, e.g., the first low level signal input end LVGL and a second low level signal input end VGL, may be provided. A potential at the current-level driving output node OUTPUT may be pulled down by a signal from the second low level signal input end VGL, while a potential at the pull-up node PU may be pulled down by a signal from the first low level signal input end LVGL which may output a low level signal at a voltage smaller than that from the second low level signal input end VGL. In this way, it is able to ensure the normal operation of the shift register unit even when the threshold voltage of the TFT M3 is of a negative value.

Figure 7:
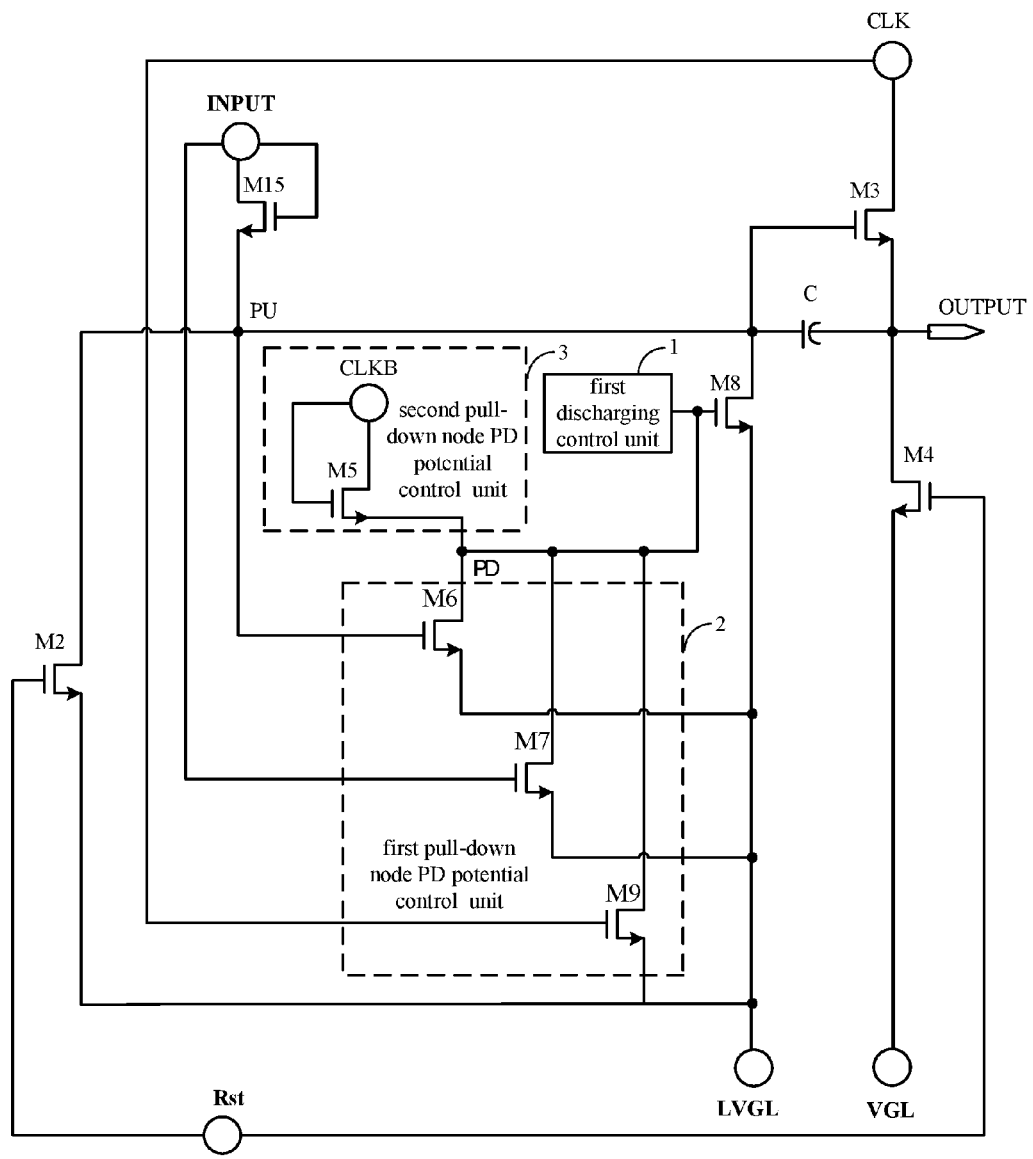
FIG. 7 is still yet another schematic view showing the shift register unit according to one embodiment of the present disclosure.

In addition, as shown in FIG. 7, the shift register unit may further include: a driving signal input end CLK configured to receive a gate driving signal; a TFT M3, a gate electrode of which is connected to the pull-up node PU, and a source electrode and a drain electrode of which are connected to the driving signal input end CLK and the current-level driving output node OUTPUT; a first resetting TFT M2, a gate electrode of which is connected to the resetting signal input end Rst, and a source electrode and a drain electrode of which are connected to the first low level signal input end LVGL and the pull-up node PU respectively; and a second resetting TFT M4, a gate electrode of which is connected to the resetting signal input end Rst, and a source electrode and a drain electrode of which are connected to the current-level driving output node OUTPUT and the second low level signal input end VGL. The first low level signal from the first low level signal input end is at a voltage less than a second low level signal from the second low level signal input end.

In order to ensure the normal operation of the current-level driving output node OUTPUT, in the embodiments of the present disclosure, at least one TFT M13 and/or TFT M14 are provided so as to assist pulling down the potential at the current-level driving output node OUTPUT. The TFT M13 is controlled by the pull-down node PD, while the TFT M14 is controlled by a signal from the pull-down node PD control signal input end CLKB.

In accordance with a driving sequence, after the current-level driving output node OUTPUT outputs a high level, the pull-down node PD shall be at a high level, so as to enable the pull-down TFT M8 to be in the on state, thereby to ensure the pull-up node PU to be at a low level. After the current-level driving output node OUTPUT outputs a high level, the pull-down node PD control signal input end CLKB outputs a high level.

Hence, after the current-level driving output node OUTPUT outputs a high level, the pull-down node PD is at a high level, and the pull-down node PD control signal input end CLKB also outputs a high level, so as to reset the signal, thereby to back up the second resetting TFT M4.

Figure 8:
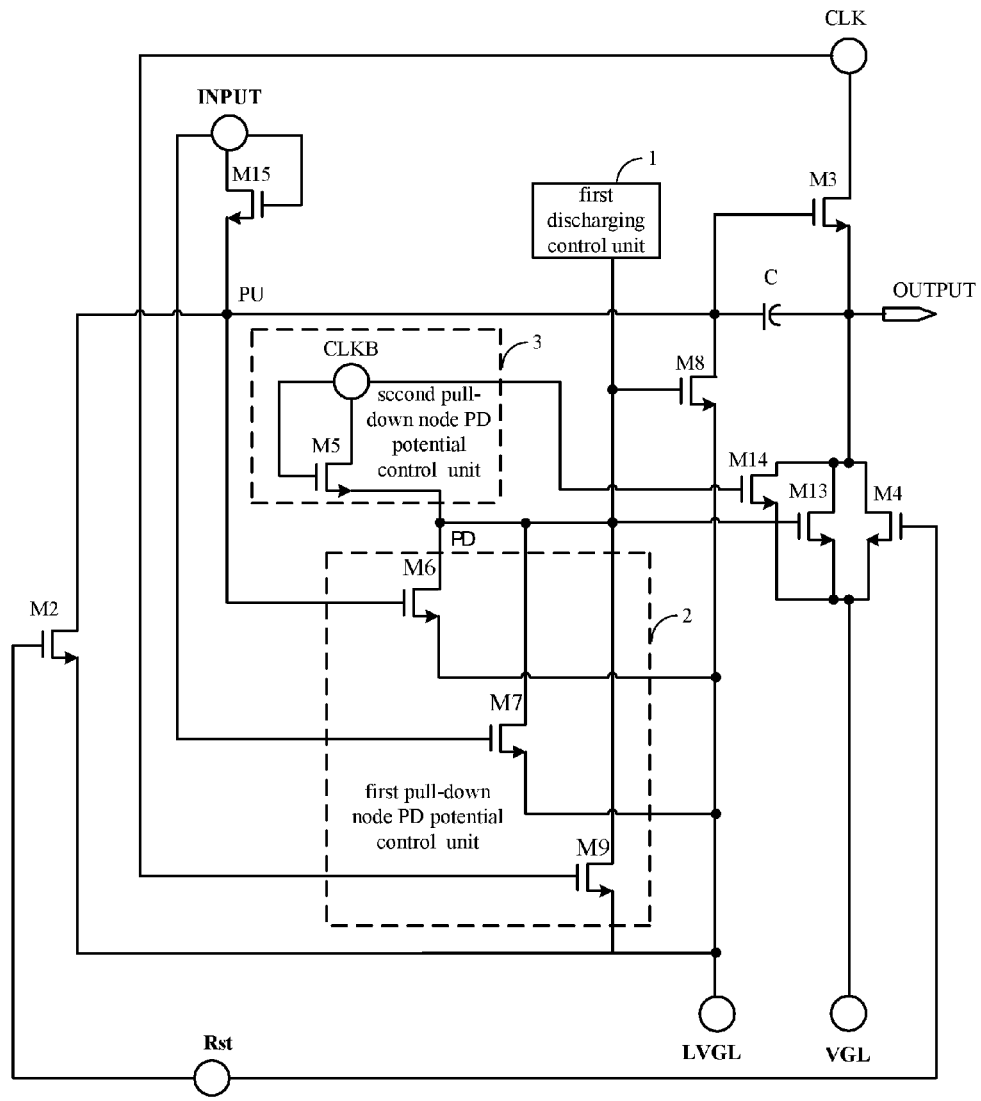
FIG. 8 is still yet another schematic view showing the shift register unit according to one embodiment of the present disclosure.

In addition, as shown in FIG. 8, the shift register unit may further include: a TFT M13, a gate electrode of which is connected to the pull-down node PD, and a source electrode and a drain electrode of which are connected to the current-level driving output node OUTPUT and the second low level signal input end VGL respectively; and/or a TFT M14, a gate electrode of which is connected to the pull-down node PD control signal input end CLKB, and a source electrode and a drain electrode of which are connected to the current-level driving output node OUTPUT and the second low level signal input end VGL respectively. After the current-level driving output node OUTPUT outputs a high level, the pull-down node PD control signal input end CLKB outputs a high level.

In the related art, each shift register unit may output a gate driving signal to a gate line at a display region to achieve progressive scanning at the display region, output a control signal, as a resetting signal, to a previous-level shift register unit, and output a control signal, as a start signal, to a next-level shift register unit.

In the related art, each shift register unit includes only one driving output node OUTPUT, and its control operation and output operation are completed via one point, i.e., one interface. At this time, the control operation and output operation will easily influence one another.

In the embodiments of the present disclosure, a mirror node of the current-level driving output node, i.e., a current-level controlling output node OUTPUT_C, is added (both the current-level driving output node and the current-level controlling output node output an identical signal but are connected to different elements), so as to achieve the control operation and the output operation in a separate manner, thereby to prevent the mutual influence therebetween.

In an alternative embodiment, the current-level driving output node may be connected to a corresponding gate line, while the current-level controlling output node may be connected to the previous-level and the next-level shift register units.

In accordance with the driving sequence, after the current-level driving output node OUTPUT outputs a high level, the pull-down node PD shall be at a high level, so as to enable the pull-down TFT M8 to be in the on state, thereby to ensure that the pull-up node PU is at a low level. Hence, in an alternative embodiment of the present disclosure, a TFT M12 may be added and discharged under the control of the pull-down node PD. As a result, it is able to achieve the continuous discharging, thereby to prevent the current-level driving output node OUTPUT from outputting a false signal.

Figure 9:
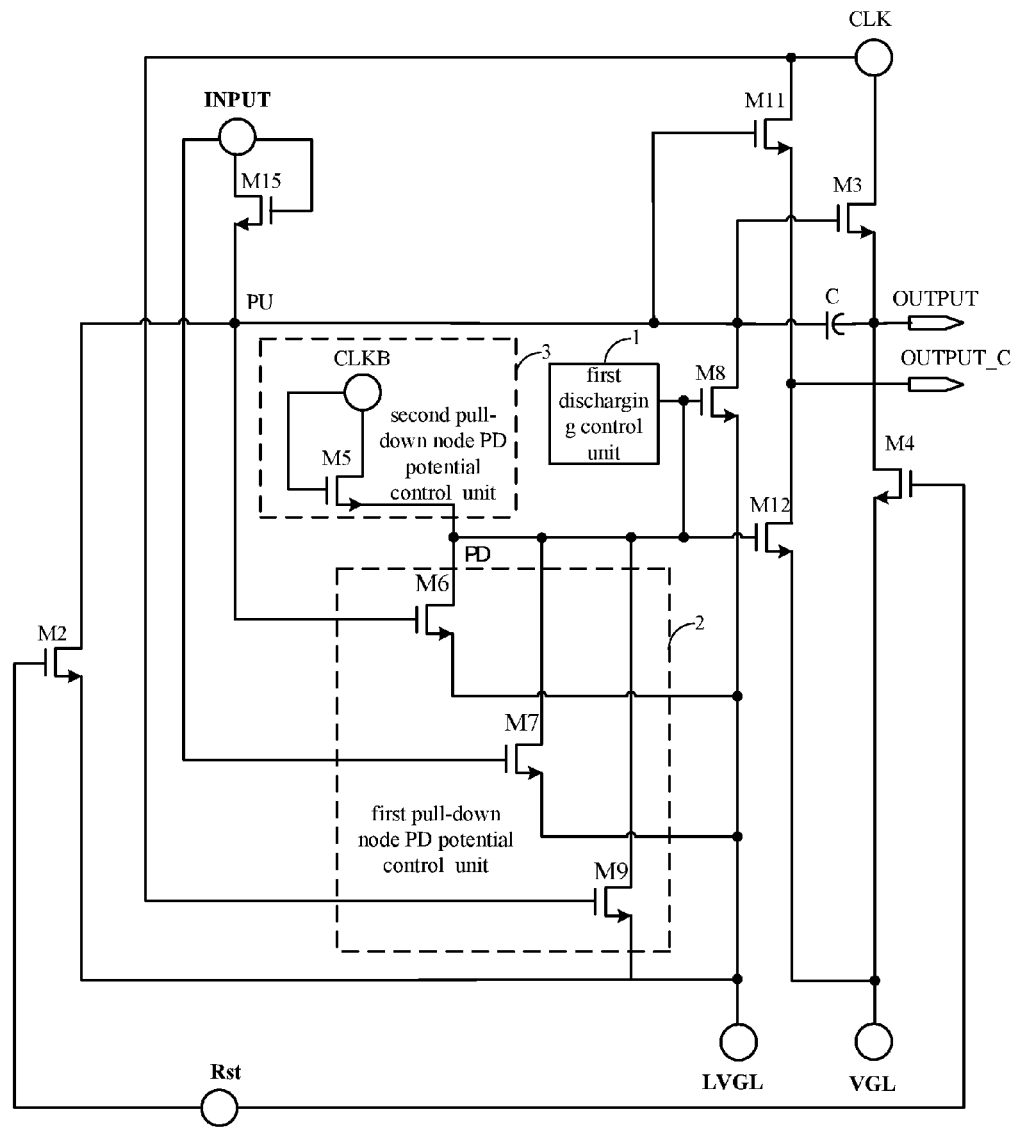
FIG. 9 is still yet another schematic view showing the shift register unit according to one embodiment of the present disclosure.

In addition, as shown in FIG. 9, the shift register unit may further include: a driving signal input end CLK configured to receive a gate driving signal; a TFT M3, a gate electrode of which is connected to the pull-up node PU, and a source electrode and a drain electrode of which are connected to the driving signal input end CLK and the current-level driving output node OUTPUT respectively; a TFT M11, a gate electrode of which is connected to the pull-up node PU, and a source electrode and a drain electrode of which are connected to the driving signal input end OUTPUT and a current-level controlling output node OUTPUT_C respectively; and a TFT M12, a gate electrode of which is connected to the pull-down node PD, and a source electrode and a drain electrode of which are connected to the current-level controlling output node OUTPUT_C and the first low level signal input end LVGL respectively. The current-level controlling output node is connected to a start signal input end INPUT of a next-level shift register unit and a resetting signal input end Rst of a previous-level shift register unit.

Figure 10:
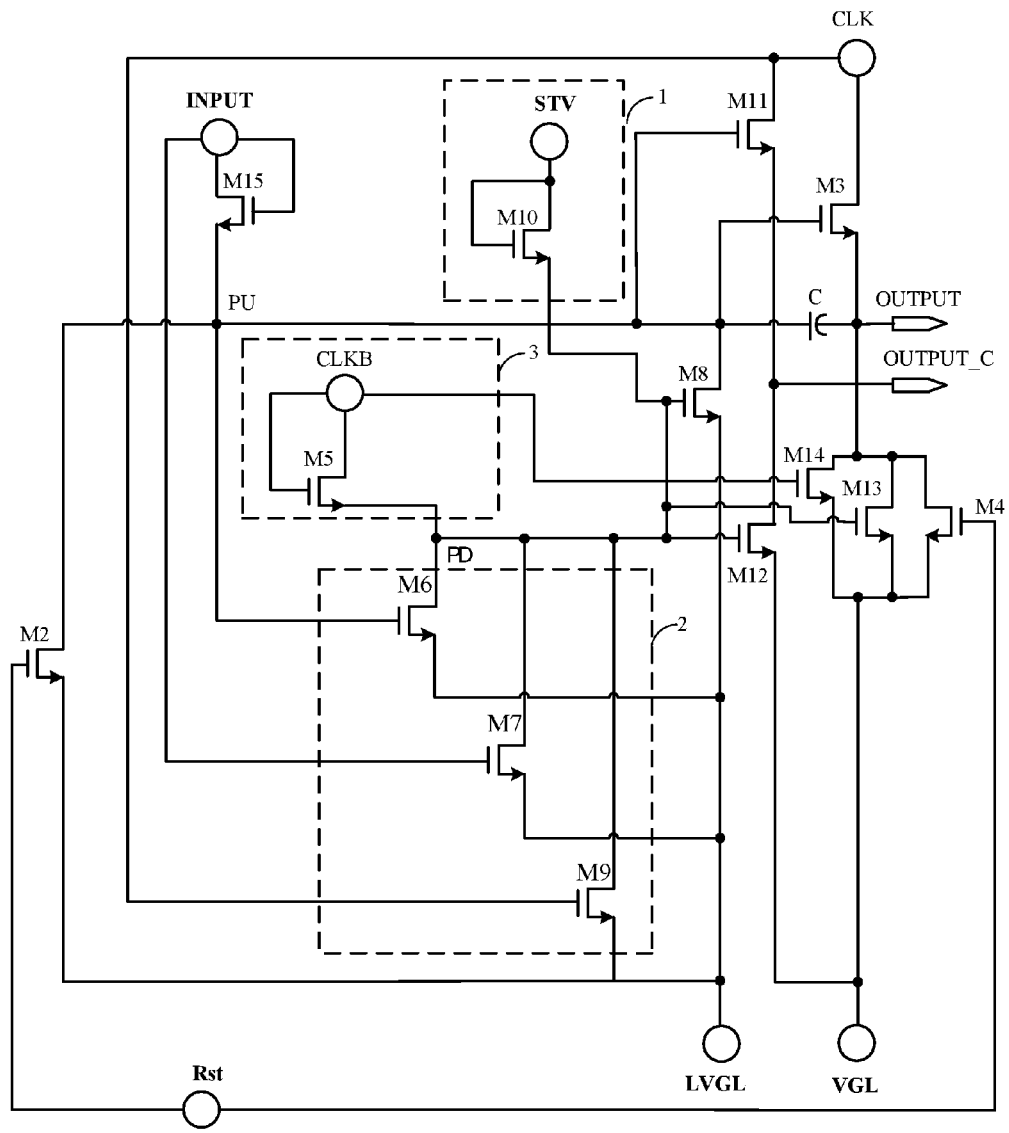
FIG. 10 is still yet another schematic view showing the shift register unit according to one embodiment of the present disclosure.

FIG. 10 shows a complete structure of the shift register unit according to one embodiment of the present disclosure.

The TFTs involved in the embodiments of the present disclosure may be N-type TFTs. Of course, the TFTs may also be P-type TFTs and the driving sequence is simply changed.

The present disclosure further provides in some embodiments a method for driving the above-mentioned shift register unit. The method may include a step of, between the first time point and the second time point, outputting by the first discharging control unit 1 a first control signal to the gate electrode of the discharging TFT M1, so as to enable the discharging TFT M1 to be in the on state, electrically connect the first low level signal input end LVGL and the pull-up node PU which are connected to the source electrode and the drain electrode of the discharging TFT M1 respectively, and output a first low level signal received by the first low level signal input end LVGL to the pull-up node PU, thereby to discharge the pull-up node PU.

The first time point may be an time point when the processing of the first frame by the shift register unit is ended, and the second time point may be a time point when the processing of a second frame adjacent to the first frame by the shift register unit is started.

Figure 11:
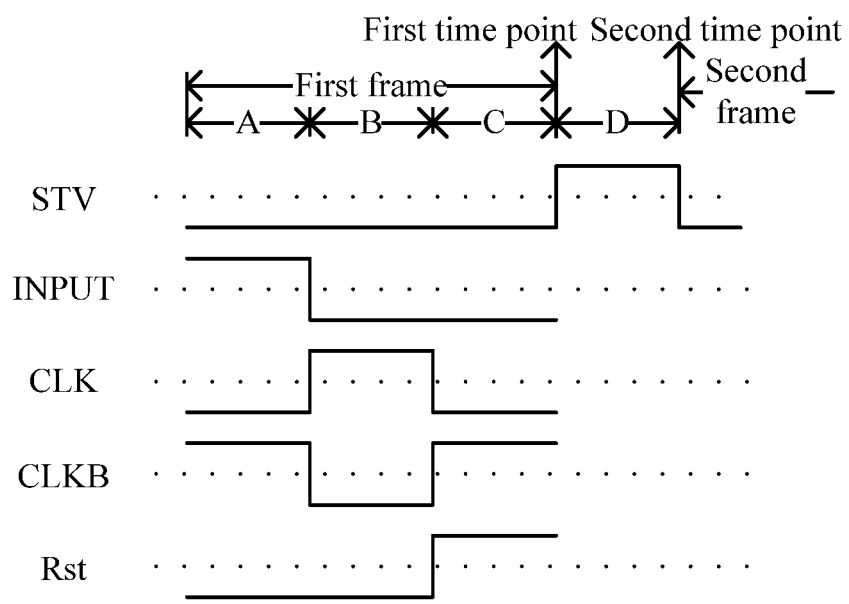
FIG. 11 is a sequence diagram of the shift register unit according to one embodiment of the present disclosure.

A specific operational period of the shift register unit in FIG. 10 will be described hereinafter when the shift register unit has a driving sequence in FIG. 11.

For the shift register unit in the embodiments of the present disclosure, within one frame, there may exist three stages, e.g., a first stage (a pre-charging stage), a second stage (a charging stage) and a third stage (a discharging and resetting stage). Because the pull-up node PU is discharged between two adjacent frames in the embodiments of the present disclosure, there is also a discharging stage between the two adjacent frames, as shown in FIG. 11.

To be specific, at the first stage, i.e., at the pre-charging stage (A in FIG. 11), the first control signal input end STV receives a low level signal, the start signal input end INPUT receives a high level signal, the driving signal input end CLK receives a low level signal, the pull-down node PD control signal input end CLKB receives a high level signal, and the resetting signal input end Rst receives a low level signal. Correspondingly, the TFTs M15, M6 and M7 are in the on state, the potential at the pull-up node PU is pulled up, the potential at the pull-down node PD is pulled down, the TFT M14 is in the on state, the driving output node OUTPUT outputs a low level signal, the TFT M11 is in the on state, and the controlling output node OUTPUT_C outputs a low level signal.

At the second stage, i.e., at the charging stage (also referred to as an outputting stage), the first control signal input end STV receives a low level signal, the start signal input end INPUT receives a low level signal, the driving signal input end CLK receives a high level signal, the pull-down node PD control signal input end CLKB receives a low level signal, and the resetting signal input end Rst receives a low level signal. Correspondingly, the TFT M3 is in the on state, the driving output node OUTPUT outputs a high level signal, the potential at the pull-up node PU is pulled up again due to a bootstrapping effect of the capacitor C, the TFT M11 is in the on state, the controlling output node OUTPUT_C outputs a high level signal, the TFT M9 is in the on state, and the pull-down node PD is discharged so that the potential at the pull-down node PD is pulled down continuously.

At the third stage, i.e., at the discharging and resetting stage, the first control signal input end STV receives a low level signal, the start signal input end INPUT receives a low level signal, the driving signal input end CLK receives a low level signal, the pull-down node PD control signal input end CLKB receives a high level signal, and the resetting signal input end Rst receives a high level signal. Correspondingly, the TFT M5 is in the on state, and the TFTs M6, M7 and M9 are in an off state, so as to pull up the potential at the pull-down node PD, thereby to enable the pull-down TFT M8 to be in the on state. Meanwhile, the first resetting TFT M2 is also in the on state, so as to discharge the pull-up node PU. The TFTs M12, M13 and M14 and the second resetting TFT M4 are in the on state, so as to discharge the driving output node OUTPUT and the controlling output node OUTPUT_C, thereby to reset the pull-up node PU, the driving output node OUTPUT and the controlling output node OUTPUT_C.

At the fourth stage, i.e., at the discharging stage, the first control signal input end STV receives a high level signal, and the other signal input ends do not receive any signal. Correspondingly, the controlling TFT M10 and the pull-down TFT M8 are in the on state, so as to discharge the pull-up node PU between the processings of two adjacent frames, i.e., between the first time point and the second time point. As a result, it is able to release a residual electric signal in the pull-up node PU after the processing of the previous frame in time, prevent the residual electric signal from being accumulated as a noise in the processing of a next frame, and prevent the occurrence of such conditions as outputting the gate driving signal falsely, thereby to ensure the normal operation of the shift register unit as possible.

Based upon the above, the present disclosure further provides in some embodiments a shift register including a plurality of the above-mentioned shift register units arranged in a cascading manner.

Figure 12:
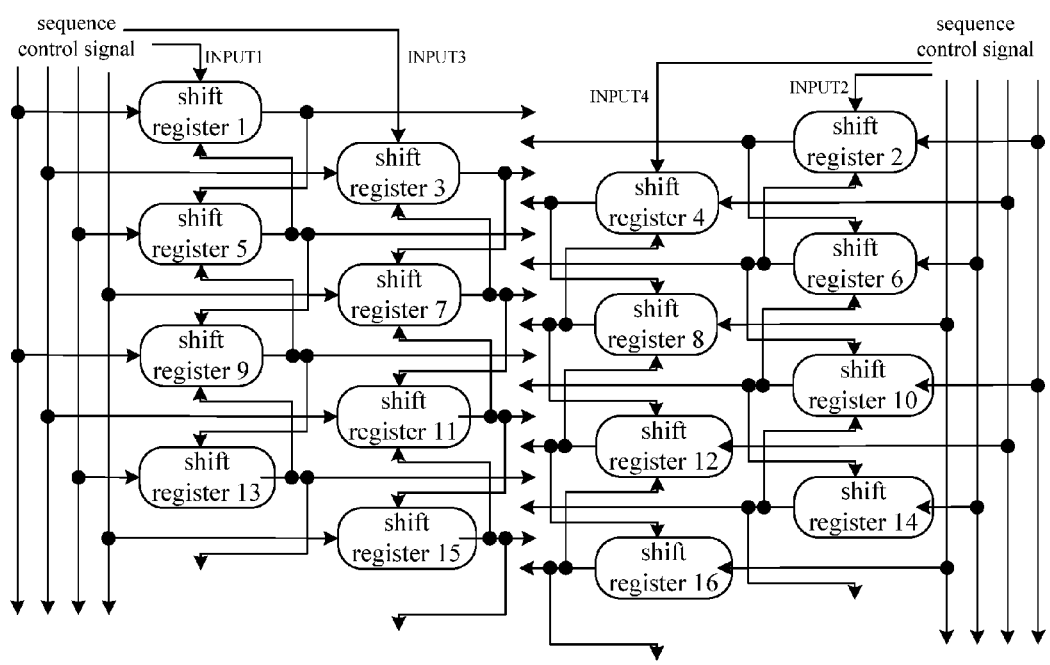
FIG. 12 is a schematic view showing a shift register according to one embodiment of the present disclosure.

The shift register may be a single-gate or double-gate shift register. The single-gate shift register is commonly used in the art, and thus will not be particularly described herein. FIG. 12 shows the structure of the double-gate shift register.

The present disclosure further provides in some embodiments a display panel including the above-mentioned shift register.

The present disclosure further provides in some embodiments a display device including the above-mentioned display panel. The display device may be a liquid crystal panel, a liquid crystal television, a liquid crystal display, an organic light-emitting diode (OLED) panel, an OLED display, a plasma display or an electronic paper.

The shift register unit, the shift register, the display panel and the display device in the embodiments of the present disclosure are particularly applicable to a GOA circuit manufactured by a low temperature poly-Si (LTPS) process or an a-Si process.

It should be appreciated that, a pixel circuit in the embodiments of the present disclosure is applicable to a-Si, poly-Si or oxide TFTs. In addition, the pixel circuit may be readily altered so as to be applicable to P-type TFTs or complementary metal-oxide-semiconductor transistor (CMOS) transistors.

According to the shift register unit, the shift register, the display panel and the display device in the embodiments of the present disclosure, the shift register unit includes: the first low level signal input end configured to receive the first low level signal; the discharging TFT, the source electrode and the drain electrode of which are connected to the first low level signal input end and the pull-up node respectively; and the first discharging control unit connected to the gate electrode of the discharging TFT and configured to output the first control signal to the gate electrode of the discharging TFT between the first time point and the second time point, so as to enable the discharging TFT to be in the on state and output the first low level signal to the pull-up node, thereby to discharge the pull-up node. The first time point is an time point when the processing of the first frame by the shift register is ended, and the second time point is a time point when the processing of the second frame adjacent to the first frame by the shift register is started. As a result, it is able to pull down a potential at the pull-up node between the processings of two adjacent frames, and release a residual electric signal in the pull-up node after the processing of a previous frame in time, thereby to prevent the residual electric signal from being accumulated as a noise in the processing of a next frame and ensure the normal operation of the shift register unit as possible.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A shift register unit, a plurality of which is cascaded to form a shift register, the shift register unit comprising a bootstrapping capacitor connected between a current-level driving output node and a pull-up node,
the shift register unit further comprising:
a first low level signal input end configured to receive a first low level signal;
a discharging thin film transistor (TFT), a source electrode and a drain electrode of which are connected to the first low level signal input end and the pull-up node respectively; and
a first discharging control unit connected to a gate electrode of the discharging TFT and configured to output a first control signal to the gate electrode of the discharging TFT only between a first time point and a second time point, so as to enable the discharging TFT to be in an on state, thereby to output the first low level signal to the pull-up node and discharge the pull-up node,
wherein the first time point is a time point when processing of a first frame by the shift register is ended, and the second time point is a time point when processing of a second frame immediately adjacent to the first frame by the shift register is started,
wherein the discharging TFT is a first resetting TFT, the gate electrode of which is connected to a resetting signal input end, or a pull-down TFT, the gate electrode of which is connected to a pull-down node,
wherein the shift register unit further comprises:
a first pull-down node potential control unit configured to control the pull-down node to be at a low level when the pull-up node is at a high level; and
a second pull-down node potential control unit configured to control the pull-down node to be at a high level after the current-level driving output node outputs a high level,
wherein the first pull-down node potential control unit comprises:
a TFT, a gate electrode of which is connected to the pull-up node, and a source electrode and a drain electrode are connected to the pull-down node and the first low level signal input end respectively; and
a TFT, a gate electrode of which is connected to a start signal input end, and a source electrode and a drain electrode of which are connected to the pull-down node and the first low level signal input end, and
the second pull-down node potential control unit comprises:
a pull-down node control signal input end configured to receive a first pull-down node control signal, which is a high level after a high level is outputted from the current-level driving output node; and
a TFT, a gate electrode of which is connected to the pull-down node control signal input end, and a source electrode and a drain electrode of which are connected to the pull-down node control signal input end and the pull-down node respectively,
the shift register unit further comprising:
a driving signal input end configured to receive a gate driving signal;
a TFT, a gate electrode of which is connected to the pull-up node, and a source electrode and a drain electrode of which are connected to the driving signal input end and the current-level driving output node respectively;
a TFT, a gate electrode of which is connected to the pull-up node, and a source electrode and a drain electrode of which are connected to the driving signal input end and a current-level controlling output node respectively; and
a TFT, a gate electrode of which is connected to the pull-down node, and a source electrode and a drain electrode of which are connected to the current-level controlling output node and a second low level signal input end respectively,
wherein the current-level controlling output node is connected to a start signal input end of a next-level shift register unit and a resetting signal input end of a previous-level shift register unit,
the shift register unit further comprising:
a TFT, a gate electrode of which is connected to the pull-down node, and a source electrode and a drain electrode of which are connected to the current-level driving output node and the second low level signal input end respectively; and
a TFT, a gate electrode of which is connected to the pull-down node control signal input end, and a source electrode and a drain electrode of which are connected to the current-level driving output node and the second low level signal input end respectively,
wherein after the current-level driving output node outputs a high level, a high level is inputted to the pull-down node control signal input end,
the first pull-down node potential control unit further comprises a TFT, a gate electrode of which is connected to the gate driving signal input end, and a source electrode and a drain electrode of which are connected to the pull-down node and the first low level signal input end respectively, and
the gate driving signal is of a phase reverse to the first pull-down node control signal.

2. The shift register unit according to claim 1, wherein the first discharging control unit comprises:
a first control signal input end configured to receive the first control signal between the first time point and the second time point; and
a controlling TFT, a gate electrode of which is connected to the first control signal input end, and a source electrode and a drain electrode of which are connected to the first control signal input end and the gate electrode of the discharging TFT respectively.

3. The shift register unit according to claim 1, wherein a high level signal and a low level signal are alternately used as the first pull-down node control signal.

4. A method for driving the shift register unit according to claim 1, comprising:
only between the first time point and the second time point, outputting by the first discharging control unit the first control signal to the gate electrode of the discharging TFT, so as to enable the discharging TFT to be in the on state,
electrically connecting the first low level signal input end and the pull-up node which are connected to the source electrode and the drain electrode of the discharging TFT respectively, and
outputting the first low level signal received by the first low level signal input end to the pull-up node, thereby to discharge the pull-up node.

5. The method according to claim 4, wherein at a first stage, a first control signal input end receives a low level signal, a start signal input end receives a high level signal, a driving signal input end receives a low level signal, a pull-down node control signal input end receives a high level signal, and a resetting signal input end receives a low level signal;

at a second stage, the first control signal input end receives a low level signal, the start signal input end receives a low level signal, the driving signal input end receives a high level signal, the pull-down node control signal input end receives a low level signal, and the resetting signal input end receives a low level signal;

at a third stage, the first control signal input end receives a low level signal, the start signal input end receives a low level signal, the driving signal input end receives a low level signal, the pull-down node control signal input end receives a high level signal, and the resetting signal input end receives a high level signal;

at a fourth stage, the first control signal input end receives a high level signal, and the start signal input end, the driving signal input end, the pull-down node control signal input end and the resetting signal input end do not receive any signal;

The first stage, the second stage and the third stage form a continuous time period within each frame period; and the fourth stage is located between the first time point and the second time point.

6. A shift register, comprising a plurality of the shift register units according to claim 1 arranged in a cascading manner.

7. A display panel comprising the shift register according to claim 6.

8. A display device comprising the display panel according to claim 7.

9. The shift register unit according to claim 1, further comprising:

a second resetting TFT, a gate electrode of which is connected to a resetting signal input end, and a source electrode and a drain electrode of which are connected to the first low level signal input end and the pull-up node respectively; and a third resetting TFT, a gate electrode of which is connected to the resetting signal input end, and a source electrode and a drain electrode of which are connected to the current-level driving output node and the second low level signal input end, wherein the first low level signal from the first low level signal input end is at a voltage less than a second low level signal from the second low level signal input end.

10. A shift register unit, a plurality of which is cascaded to form a shift register, the shift register unit comprising a bootstrapping capacitor connected between a current-level driving output node and a pull-up node, the shift register unit further comprising:

a discharging thin film transistor (TFT), a source electrode and a drain electrode of which are connected to a first low level signal input end that is configured to receive a first low level signal and the pull-up node respectively; and a first discharging control unit connected to a gate electrode of the discharging TFT and configured to output a first control signal to the gate electrode of the discharging TFT only between a first time point and a second time point, so as to enable the discharging TFT to be in an ON state, thereby to output the first low level signal to the pull-up node and discharge the pull-up node, wherein the first time point is a time point when processing of a first frame by the shift register is ended, and the second time point is a time point when processing of a second frame immediately adjacent to the first frame by the shift register is started, wherein the discharging TFT is a first resetting TFT, the gate electrode of which is connected to a resetting signal input end, or a pull-down TFT, the gate electrode of which is connected to a pull-down node, wherein the shift register unit further comprises:

a TFT, a gate electrode of which is connected to the pull-up node, and a source electrode and a drain electrode are connected to the pull-down node and the first low level signal input end respectively;

a TFT, a gate electrode of which is connected to a start signal input end, and a source electrode and a drain electrode of which are connected to the pull-down node and the first low level signal input end; and a TFT, a gate electrode of which is connected to a pull-down node control signal input end that is configured to receive a first pull-down node control signal, and a source electrode and a drain electrode of which are connected to the pull-down node control signal input end and the pull-down node respectively, wherein the first pull-down node control signal is a high level after a high level is outputted from the current-level driving output node;

a TFT, a gate electrode of which is connected to the pull-up node, and a source electrode and a drain electrode of which are connected to a driving signal input end that is configured to receive a gate driving signal and the current-level driving output node respectively;

a TFT, a gate electrode of which is connected to the pull-up node, and a source electrode and a drain electrode of which are connected to the driving signal input end and a current-level controlling output node respectively; and a TFT, a gate electrode of which is connected to the pull-down node, and a source electrode and a drain electrode of which are connected to the current-level controlling output node and a second low level signal input end respectively;

a TFT, a gate electrode of which is connected to the pull-down node, and a source electrode and a drain electrode of which are connected to the current-level driving output node and the second low level signal input end respectively;

a TFT, a gate electrode of which is connected to the pull-down node control signal input end, and a source electrode and a drain electrode of which are connected to the current-level driving output node and the second low level signal input end respectively; and a TFT, a gate electrode of which is connected to the gate driving signal input end, and a source electrode and a drain electrode of which are connected to the pull-down node and the first low level signal input end respectively, wherein the current-level controlling output node is connected to a start signal input end of a next-level shift register unit and a resetting signal input end of a previous-level shift register unit, after the current-level driving output node outputs a high level, a high level is inputted to the pull-down node control signal input end, and the gate driving signal is of a phase reverse to the first pull-down node control signal.

* * * * *